(12) United States Patent
Pan et al.

(10) Patent No.: US 12,111,696 B2
(45) Date of Patent: Oct. 8, 2024

(54) FLEXIBLE DISPLAY MODULE AND FLEXIBLE DISPLAY APPARATUS

(71) Applicant: Huawei Technologies Co., Ltd., Shenzhen (CN)

(72) Inventors: Liangyu Pan, Dongguan (CN); Lei Wang, Dongguan (CN); Yuan Yan, Shenzhen (CN); Haiyan Li, Shenzhen (CN); Yongqiang Pang, Shenzhen (CN); Yang Liu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 138 days.

(21) Appl. No.: 17/769,123

(22) PCT Filed: Aug. 18, 2020

(86) PCT No.: PCT/CN2020/109834
§ 371 (c)(1),
(2) Date: Apr. 14, 2022

(87) PCT Pub. No.: WO2021/073246
PCT Pub. Date: Apr. 22, 2021

(65) Prior Publication Data
US 2023/0135045 A1    May 4, 2023

(30) Foreign Application Priority Data

Oct. 15, 2019 (CN) .......................... 201910980128.1

(51) Int. Cl.
*G06F 1/16* (2006.01)
*G09F 9/30* (2006.01)
(Continued)

(52) U.S. Cl.
CPC .......... *G06F 1/1652* (2013.01); *G06F 1/1616* (2013.01); *G06F 1/1637* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 8,816,977 B2 * | 8/2014 | Rothkopf | G06F 3/016 |
| | | | 345/169 |
| 10,868,264 B2 * | 12/2020 | Shin | H10K 77/111 |

(Continued)

FOREIGN PATENT DOCUMENTS

| CN | 107610595 A | 1/2018 |
|---|---|---|
| CN | 207294591 U | 5/2018 |

(Continued)

*Primary Examiner* — Lisa Lea-Edmonds
(74) *Attorney, Agent, or Firm* — Conley Rose, P.C.

(57) ABSTRACT

A flexible display module includes a cover, a flexible display panel, a rigid backplane component, and an optical device that are sequentially disposed. The optical device is disposed on a side of the rigid backplane component and is away from the flexible display panel. The rigid backplane component includes a rigid backplane body and a rigid light-transmitting component. The rigid light-transmitting component is disposed between the optical device and the flexible display panel, and the rigid light-transmitting component has a light transmission feature and is rigid.

21 Claims, 5 Drawing Sheets

(51) Int. Cl.
*G06V 40/13* (2022.01)
*H10K 59/12* (2023.01)

(52) U.S. Cl.
CPC .............. *G09F 9/301* (2013.01); *G06V 40/13* (2022.01); *H10K 59/12* (2023.02)

(56) References Cited

U.S. PATENT DOCUMENTS

| | | | | |
|---|---|---|---|---|
| 11,087,110 | B2* | 8/2021 | Park | H10K 59/65 |
| 2012/0105400 | A1* | 5/2012 | Mathew | G06F 1/1637 |
| | | | | 345/207 |
| 2017/0212613 | A1* | 7/2017 | Hwang | G06F 1/1684 |
| 2018/0151641 | A1* | 5/2018 | Choo | G06F 1/1684 |
| 2018/0365472 | A1* | 12/2018 | Cai | G06V 40/1318 |
| 2019/0073505 | A1* | 3/2019 | Kwon | H05K 1/028 |
| 2019/0087630 | A1* | 3/2019 | Seo | G06F 1/1684 |
| 2019/0172875 | A1* | 6/2019 | Kang | G06F 21/32 |
| 2019/0196589 | A1* | 6/2019 | Shim | H04M 1/0266 |
| 2019/0272407 | A1* | 9/2019 | Park | G06V 40/1329 |
| 2019/0305237 | A1* | 10/2019 | Shin | H04M 1/0268 |
| 2020/0044003 | A1* | 2/2020 | Cho | G09F 9/30 |
| 2021/0098723 | A1* | 4/2021 | Shin | G06F 1/1601 |
| 2023/0135045 | A1* | 5/2023 | Pan | G06F 1/1684 |
| | | | | 361/679.27 |

FOREIGN PATENT DOCUMENTS

| | | |
|---|---|---|
| CN | 108122501 A | 6/2018 |
| CN | 108537171 A | 9/2018 |
| CN | 208112682 U | 11/2018 |
| CN | 109036163 A | 12/2018 |
| CN | 109448553 A | 3/2019 |
| CN | 208622357 U | 3/2019 |
| CN | 109684958 A | 4/2019 |
| CN | 208781246 U | 4/2019 |
| CN | 208819885 U | 5/2019 |
| CN | 110114779 A | 8/2019 |
| IN | 210956676 U | 7/2020 |

* cited by examiner

FLEXIBLE DISPLAY MODULE AND FLEXIBLE DISPLAY APPARATUS

CROSS-REFERENCE TO RELATED APPLICATIONS

This is a U.S. National Stage of International Patent Application No. PCT/CN2020/109834 filed on Aug. 18, 2020, which claims priority to Chinese Patent Application No. 201910980128.1 filed on Oct. 15, 2019. Both of the aforementioned applications are hereby incorporated by reference in their entireties.

TECHNICAL FIELD

This application relates to the field of electronic technologies, and in particular, to a flexible display module and a flexible display apparatus.

BACKGROUND

A flexible display module has many characteristics such as lightness, impact resistance, and curl ability that are not possessed by a conventional display screen, so that a display apparatus can be lighter, more portable, more aesthetic, and more fashionable. The foregoing characteristics provide wider development space for the flexible display module. Therefore, in the field of display technologies, a flexible display technology has been widely concerned with and studied.

Figure 1:
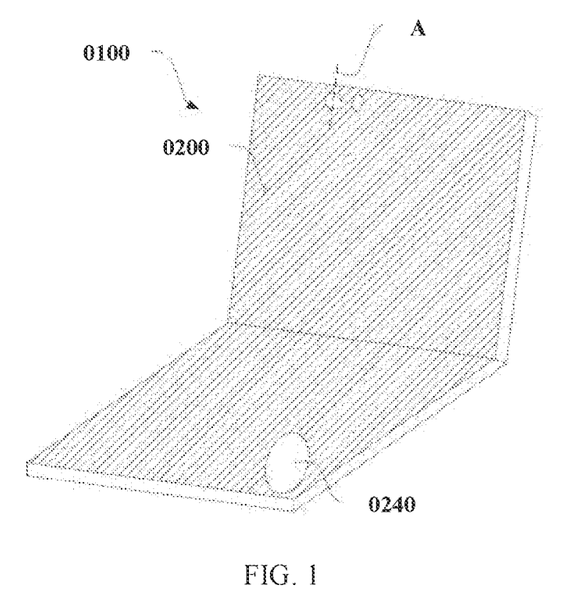
FIG. 1 is a schematic diagram of a structure of a flexible display apparatus in the conventional technology.
Figure 2:
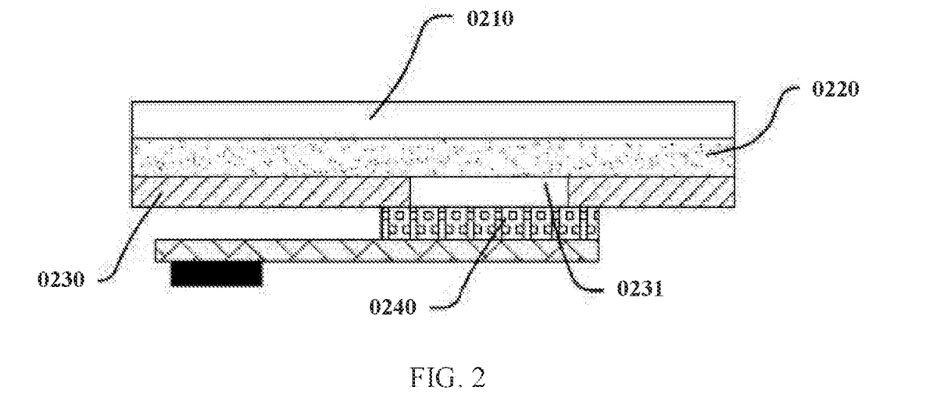
FIG. 2 is a schematic diagram of a cross-sectional structure of a location A in FIG. 1.

With an increasing demand of a user for a display with a high screen-to-body ratio, display in full screen mode is one of hot technologies currently pursued for the display apparatus. For the flexible display module, refer to FIG. 1 and FIG. 2. FIG. 1 is a schematic diagram of a structure of a flexible display apparatus in the conventional technology. FIG. 2 is a schematic diagram of a cross-sectional structure of a location A in FIG. 1. A flexible display module 0200 of a flexible display apparatus 0100 includes a cover 0210, a flexible display panel 0220, and a rigid backplane 0230 that are stacked. The rigid backplane 0230 may not only support the flexible display panel 0220, so that the flexible display panel 0220 is in a flat state, but may also be used to disperse stress to which the flexible display panel 0220 is subjected, to reduce a quantity of stress concentrations. During specific disposing of the flexible display module 0200, an optical device 0240 such as a camera or a fingerprint recognition device may be disposed on a back side of the flexible display panel 0220, and the rigid backplane 0230 needs to be provided with a through hole 0231 in a one-to-one correspondence with the optical device 0240, so that light can reach the optical device 0240, to ensure that the optical device 0240 operates. When the flexible display apparatus 0100 is in use, the flexible display module 0200 is not supported at a location of the through hole 0231, and consequently, the flexible display panel 0220 is dented, and the flexible display panel 0220 or the optical device 0240 is damaged.

SUMMARY

This application provides a flexible display module and a flexible display apparatus, to improve quality of the flexible display module, and improve a service life of the flexible display apparatus.

According to a first aspect, this application provides a flexible display module. The flexible display module includes a cover, a flexible display panel, a rigid backplane component, and an optical device that are sequentially disposed, and the optical device is disposed on a side that is of the rigid backplane component and that is away from the flexible display panel, and is located in a display area of the flexible display module. The rigid backplane component includes a rigid backplane body and a rigid light-transmitting component. The rigid light-transmitting component has a light transmission feature and is rigid, and the rigid light-transmitting component is disposed between the optical device and the flexible display panel. Therefore, light can penetrate through the rigid light-transmitting component and enter the optical device, so that the optical device operates normally. In addition, the flexible display panel and the optical device may be further isolated from each other. Even if a user presses the flexible display panel when using the flexible display module, because there is a rigid support structure, neither the flexible display panel nor the optical device is easily damaged, to improve quality and a service life of the flexible display module.

During specific disposing of the rigid backplane component, the rigid backplane body may include a through hole, the through hole is in a one-to-one correspondence with the optical device of the flexible display module, and the rigid light-transmitting component is disposed in the through hole, to support the flexible display panel, and allow light to enter the optical device.

A specific structure and an installation manner of the rigid light-transmitting component are not limited. The rigid light-transmitting component may be a curable adhesive. A liquid curable adhesive is first injected into the through hole, and then is cured, so that the rigid light-transmitting component is fastened to the rigid backplane body.

In another optional technical solution, the rigid light-transmitting component may be a rigid light-transmitting block, and then the rigid light-transmitting block is installed in the through hole of the rigid backplane body. Specifically, the rigid light-transmitting block may be bonded and fastened in the through hole of the rigid backplane body, or a solution of an interference assembly is used, so that the rigid light-transmitting block can be fixedly installed in the through hole.

During specific installation of the rigid light-transmitting block, the through hole of the rigid backplane body may further be a stepped hole. The stepped hole specifically includes a first through hole and a second through hole. The first through hole is close to the flexible display panel, the second through hole is away from the flexible display panel, and an aperture of the first through hole is greater than an aperture of the second through hole. The rigid light-transmitting block is a stepped block and fits into the through hole. In this solution, the stepped hole may snap-fit the rigid light-transmitting block. When the user uses the flexible display module, the user presses the flexible display module, so that the rigid light-transmitting block can be located in the through hole of the rigid backplane body.

During specific disposing of the rigid light-transmitting component, a surface that is of the rigid light-transmitting component and that faces the flexible display module may be flush with a surface that is of the rigid backplane body and that faces the flexible display panel. Therefore, a surface that is of the rigid backplane component and that faces the flexible display panel is flat, to improve a support effect of the flexible display panel.

In another technical solution, the rigid backplane body may include a through hole in a one-to-one correspondence with the optical device, to allow light to enter the optical device, so that the optical device can operate normally. The rigid light-transmitting component is a rigid light-transmitting plate stacked on the rigid backplane body, and the rigid light-transmitting plate is located between the rigid backplane body and the flexible display panel, to isolate the through hole of the rigid backplane body from the flexible display panel, and protect the flexible display panel and the optical device. In this solution, only a layer of rigid light-transmitting plate is added based on a solution in the conventional technology, and a process is simple.

During specific disposing of the through hole, a projection of the through hole on the flexible display panel needs to completely cover a light active area of the optical device. In other words, at least the light active area of the optical device is completely exposed out of the through hole, so that the optical device can operate normally.

In another specific technical solution, the flexible display module may include an integral rigid light-transmitting backplane. In other words, the rigid backplane body is a rigid light-transmitting backplane body, and the rigid backplane body and the rigid light-transmitting component are of an integral structure. In this solution, the flexible display module is of a simple structure.

During disposing, a specific material of the rigid light-transmitting component may be selected based on a requirement, and it only needs to be ensured that the rigid light-transmitting component has a light transmission feature and is rigid. For example, the rigid light-transmitting component may be a glass rigid light-transmitting component, a plastic rigid light-transmitting component, or a resin rigid light-transmitting component.

According to a second aspect, this application further provides a flexible display apparatus. The flexible display apparatus includes the flexible display module in any one of the foregoing technical solutions. There is a rigid light-transmitting component between an optical device of the flexible display module and a flexible display panel, to implement rigid isolation between the optical device and the flexible display panel, so as to protect the flexible display panel and the optical device, improve quality of the flexible display module, and improve a service life of the flexible display apparatus.

REFERENCE NUMERALS

Reference Numerals in the Conventional Technology

0100: Flexible display apparatus; 0200: Flexible display module;
0210: Cover; 0220: Flexible display panel;
0230: Rigid backplane; 0231: Through hole; and
0240: Optical device.

Reference Numerals in this Application

100: Flexible display apparatus; 200: Flexible display module;
210: Cover; 220: Flexible display panel;
230: Rigid backplane component; 231: Rigid backplane body;
2311: Through hole; 2312: First through hole;
2313: Second through hole; 232: Rigid light-transmitting component; and
240: Optical device.

DESCRIPTION OF EMBODIMENTS

Figure 3:
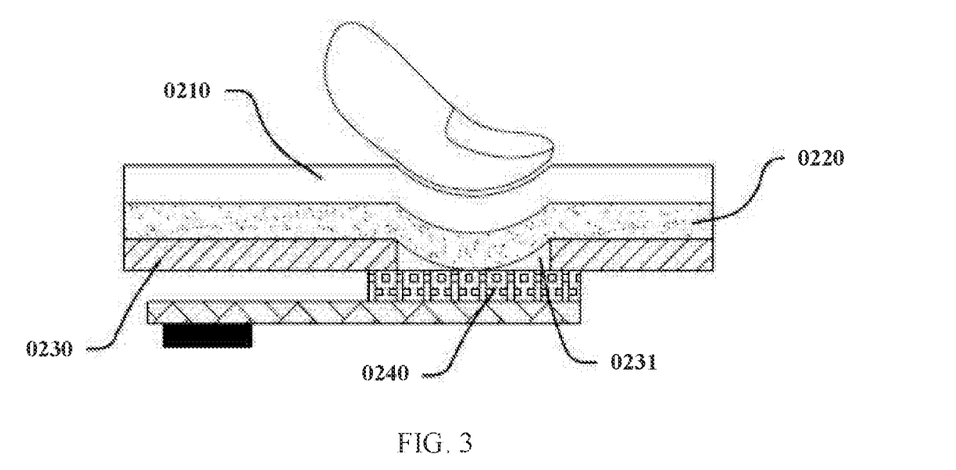
FIG. 3 is a schematic diagram of a cross-sectional structure of a flexible display module in an operating state in the conventional technology.

A flexible display module is usually applied to a foldable flexible display apparatus, and the flexible display apparatus is usually applied to a common foldable mobile terminal such as a mobile phone or a tablet computer. FIG. 1 is a schematic diagram of a structure of a flexible display apparatus in the conventional technology. Currently, there is an increasingly higher requirement for a screen-to-body ratio of a flexible display apparatus 0100. Therefore, the flexible display apparatus 0100 gradually develops a narrow frame structure or a full screen structure. A functional component of the flexible display apparatus 0100 needs to be disposed on a back side of a flexible display panel 0220 of the flexible display module 0200. The functional component of the flexible display apparatus 0100 further includes some optical devices 0240, for example, a camera, an ambient light sensor, or a fingerprint sensor. The optical device 0240 can operate only after receiving light. FIG. 2 is a schematic diagram of a cross-sectional structure of a location A in FIG. 1. The flexible display module 0200 in the conventional technology includes a cover 0210, a flexible display panel 0220, and a rigid backplane 0230 that are stacked, and the rigid backplane 0230 is of a non-transparent structure. Therefore, the rigid backplane 0230 needs to be provided with a through hole 0231, and a light active area of the optical device 0240 is made opposite to the through hole 0231, so that the optical device 0240 can receive light to operate. FIG. 3 is a schematic diagram of a cross-sectional structure of a flexible display module in an operating state in the conventional technology. When the flexible display apparatus 0100 is in use, if the flexible display module 0200 is subjected to an external force, because the flexible display panel 0220 is flexible, the flexible display panel 0220 is squeezed into the through hole 0231 of the rigid backplane 0230 due to the external force. Consequently, the flexible display panel 0220 is dented, and the flexible display panel 0220 is easily damaged. In addition, because the flexible display panel 0220 is squeezed into the through hole 0231 of the rigid backplane 0230, the optical device 0240 is squeezed, and the optical device 0240 is easily damaged. To resolve the foregoing problem, this application provides a flexible display module and a flexible display apparatus. To make the objectives, technical solutions, and advantages of this application clearer, the following further describes this application in detail by using embodiments with reference to the accompanying drawings.

Terms used in the following embodiments are merely intended to describe specific embodiments, but are not intended to limit this application. The terms "one", "a", "the", "the forgoing", "this" and "the one" of singular forms used in this specification and the appended claims of this application are also intended to include forms like "one or more", unless otherwise specified in the context clearly.

Reference to "an embodiment", "some embodiments", or the like described in this specification indicates that one or more embodiments of this application include a specific feature, structure, or characteristic described with reference to the embodiments. Therefore, statements such as "in an embodiment", "in some embodiments", "in some other embodiments", and "in other embodiments" that appear at different places in this specification do not necessarily mean referring to a same embodiment, but mean "one or more but not all of the embodiments", unless otherwise specifically emphasized. The terms "include", "comprise", "have", and their variants all mean "include but are not limited to", unless otherwise specifically emphasized.

Figure 4:
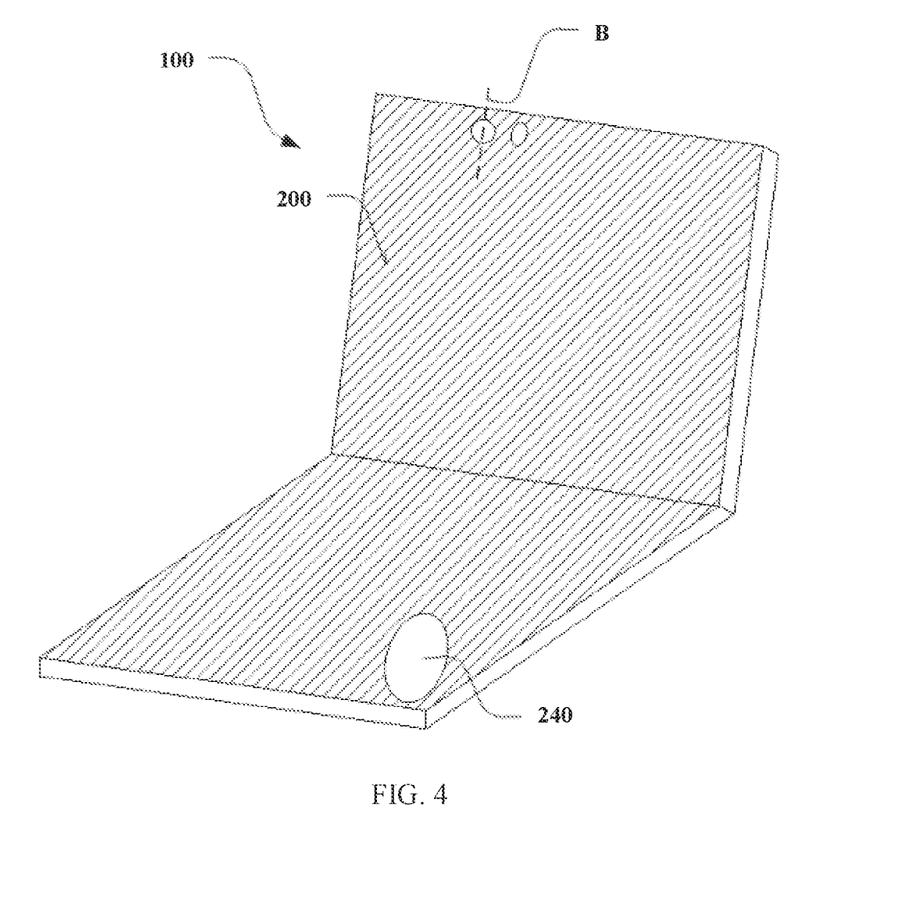
FIG. 4 is a schematic diagram of a structure of a flexible display apparatus according to an embodiment of this application.
Figure 5:
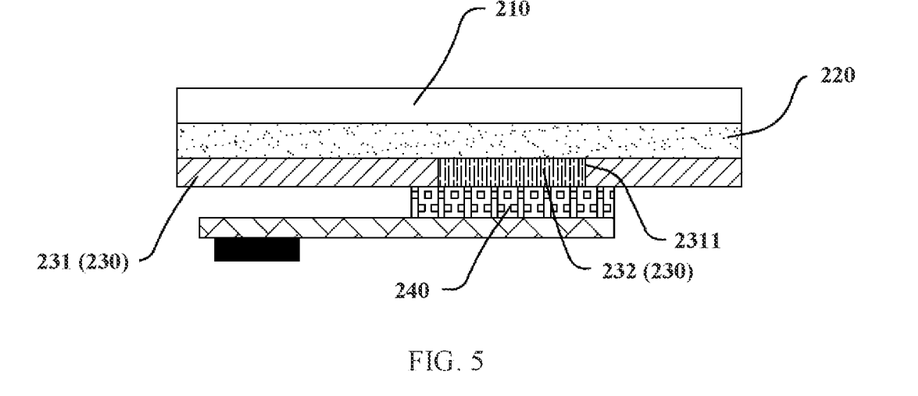
FIG. 5 is a schematic diagram of a cross-sectional structure of a flexible display module according to an embodiment of this application.

FIG. 4 is a schematic diagram of a structure of a flexible display apparatus according to an embodiment of this application. The flexible display apparatus in this embodiment of this application includes a flexible display module. FIG. 5 shows a schematic diagram of a cross-sectional structure of a location B that is in FIG. 4 and that is of a flexible display module in this embodiment of this application. A flexible display module 200 of a flexible display apparatus 100 includes a cover 210, a flexible display panel 220, a rigid backplane component 230, and an optical device 240 that are sequentially disposed. The optical device 240 is disposed on a side of the rigid backplane component 230 and that is away from the flexible display panel 220, and the optical device 240 is located in a display area of the flexible display module 200, and may be specifically located in a non-folding area. The rigid backplane component 230 is configured to support the flexible display panel 220, to disperse stress when the flexible display module 200 is subjected to the stress, so as to reduce a quantity of stress concentrations, and improve a service life of the flexible display module 200. The optical device 240 is disposed on the side that is of the rigid backplane component 230 and that is away from the flexible display panel 220. The rigid backplane component 230 includes a rigid backplane body 231 and a rigid light-transmitting component 232, and the rigid light-transmitting component 232 is disposed between the flexible display panel 220 and the optical device 240. In this solution, the rigid light-transmitting component 232 is disposed between the flexible display panel 220 and the optical device 240. In this case, light may penetrate through the rigid light-transmitting component 232 and be incident on a light active area of the optical device 240, to ensure that the optical device 240 can operate normally. In addition, the rigid light-transmitting component 232 is rigid. Therefore, the rigid light-transmitting component 232 may support the flexible display panel 220. Even when a user presses the flexible display module 200 when the user uses the flexible display apparatus 100, the rigid light-transmitting component 232 may protect both the flexible display panel 220 and the optical device 240, to improve quality and the service life of the flexible display module 200, and help implement a narrow frame structure or a full screen structure of the flexible display apparatus 100.

In a specific embodiment, a structure of the rigid backplane component 230 is not specifically limited. Still referring to FIG. 5, the rigid backplane body 231 of the rigid backplane component 230 includes a through hole 2311, the through hole 2311 is in a one-to-one correspondence with the optical device 240, the light active area of the optical device 240 is opposite to the through hole 2311, and light may be incident on the optical device 240 through the through hole 2311, so that the optical device 240 can operate normally. In a specific technical solution, the rigid light-transmitting component 232 may be disposed in the through hole 2311 of the rigid backplane. The rigid light-transmitting component 232 may allow light to be normally incident on the optical device 240, may perform a rigid isolation function between the optical device 240 and the flexible display panel 220, and support the flexible display panel 220, so that when the user presses the flexible display panel 220, the flexible display panel 220 and the optical device 240 are not easily damaged. In this solution, a thickness of the rigid backplane component 230 does not need to be increased, to help maintain a thickness of the flexible display module 200, and implement a thinning design of the flexible display apparatus 100.

In this embodiment of this application, a manner in which the rigid light-transmitting component 232 is disposed in the through hole 2311 of the rigid backplane body 231 is not specifically limited. In a specific implementation, the rigid light-transmitting component 232 may be a curable adhesive. To manufacture the rigid backplane component 230, a liquid curable adhesive may be injected into the through hole 2311, and then the curable adhesive is cured, to obtain the rigid light-transmitting component 232. In this solution, a manufacturing process of the rigid light-transmitting component 232 is simple, so that the rigid light-transmitting component 232 can be stably installed in the through hole 2311 of the rigid backplane body 231, to improve structural reliability of the rigid backplane component 230.

Figure 6:
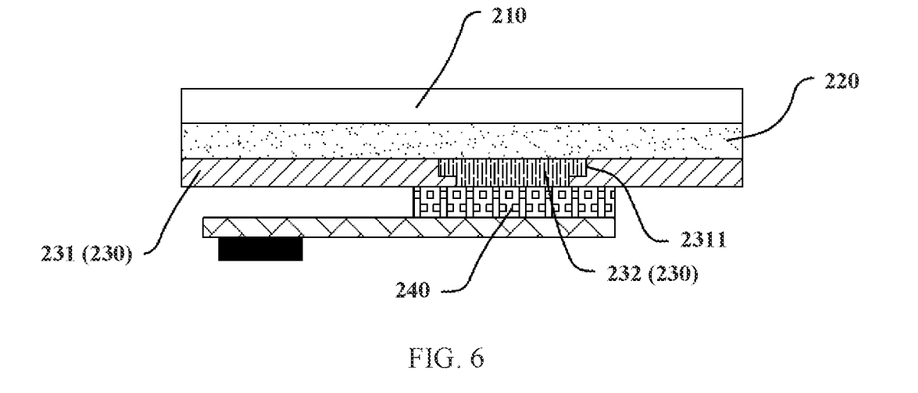
FIG. 6 is a schematic diagram of a cross-sectional structure of a flexible display module according to an embodiment of this application.
Figure 7:
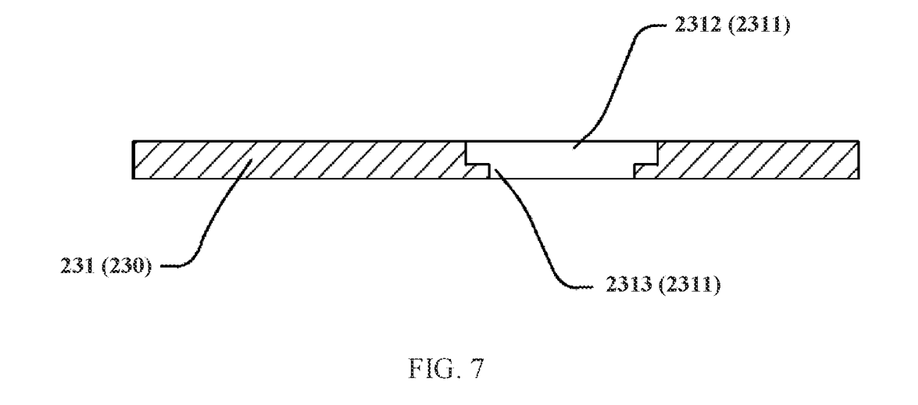
FIG. 7 is a schematic diagram of a structure of a rigid backplane body according to an embodiment of this application.

In another specific implementation, the rigid light-transmitting component 232 may be a rigid light-transmitting block. The rigid light-transmitting block is installed in the through hole 2311 of the rigid backplane body. Specifically, the rigid light-transmitting block may be bonded and fastened in the through hole 2311, or may be installed in the through hole 2311 through an interference assembly. This is not specifically limited in this application. FIG. 6 is a schematic diagram of a structure of a cross-sectional structure of a flexible display module according to an embodiment of this application. FIG. 7 is a schematic diagram of a structure of a rigid backplane body 231 according to an embodiment of this application. In this embodiment, the through hole 2311 of the rigid backplane body is a stepped hole, and the stepped hole includes a first through hole 2312 and a second through hole 2313. The first through hole 2312 is located on a side close to the flexible display panel 220, the second through hole 2313 is located on a side away from the flexible display panel 220, and an aperture of the first through hole 2312 is greater than an aperture of the second through hole 2313. The rigid light-transmitting block is also a stepped block, and the stepped block fits into the stepped hole. When the stepped block is installed in the stepped hole, the stepped hole may limit the stepped block along a side away from the flexible display panel 220, so that after the rigid light-transmitting block is installed in the stepped hole of the rigid backplane body, even when the flexible display panel 220 is under pressure, the rigid light-transmitting block may be limited in the through hole 2311 of the rigid backplane body. An installation structure is reliable, no other fitting structure is required, and an installation process is simple.

During specific disposing, a surface that is of the rigid light-transmitting component 232 and that faces the flexible display panel 220 is flush with a surface that is of the rigid backplane body 231 and that faces the flexible display panel 220. In this solution, a support structure on a back side of the flexible display panel 220 is a complete plane, and may well support the flexible display panel 220, to increase the service life of the flexible display panel 220.

Figure 8:
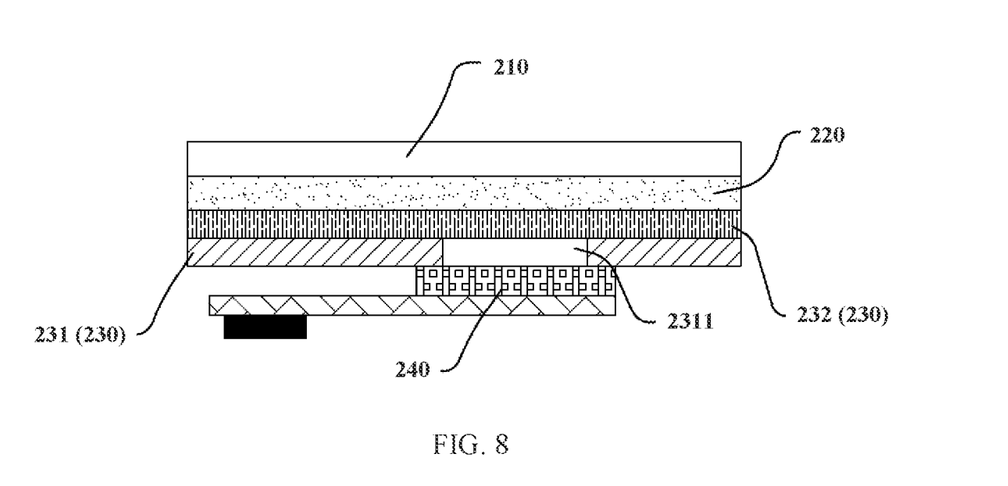
FIG. 8 is a schematic diagram of a cross-sectional structure of a flexible display module according to an embodiment of this application.

FIG. 8 is a schematic diagram of a cross-sectional structure of a flexible display module according to an embodiment of this application. In an embodiment, the rigid backplane body 231 of the rigid backplane component 230 includes the through hole 2311, the through hole 2311 is in a one-to-one correspondence with the optical device 240, the light active area of the optical device 240 is opposite to the through hole 2311, and light may be incident on the optical device 240 through the through hole 2311, so that the optical device 240 can operate normally. In this solution, the rigid light-transmitting component 232 is a rigid light-transmitting plate, the rigid light-transmitting plate and the rigid backplane body 231 are stacked, and the rigid light-transmitting plate is located on the side that is of the rigid backplane body 231 and that faces the flexible display panel 220. Therefore, there is a rigid light-transmitting plate between the rigid backplane body 231 and the flexible display panel 220, to isolate the flexible display panel 220 from the through hole 2311. The flexible display panel 220 is not dented into the through hole 2311 when the user uses the flexible display apparatus 100, so that the flexible display panel 220 and the optical device 240 can be protected from being easily damaged.

In a specific embodiment, a size of the through hole 2311 needs to allow the corresponding optical device 240 to operate normally. Therefore, a projection of the through hole 2311 on the flexible display panel 220 needs to completely cover the light active area of the optical device 240. Specifically, the through hole 2311 may completely fit the light active area of the optical device 240, or the size of the through hole 2311 may be greater than the light active area of the optical device 240, to help accept a large installation tolerance, and help improve light receiving reliability of the light active area of the optical device 240.

Figure 9:
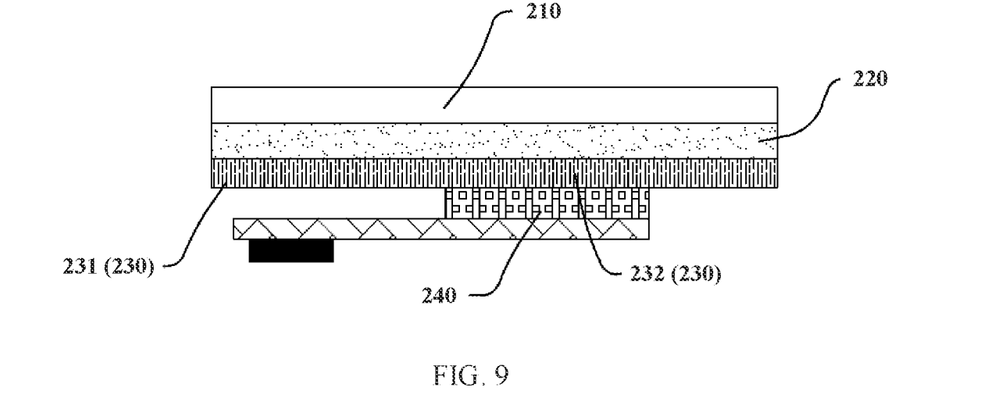
FIG. 9 is a schematic diagram of a cross-sectional structure of a flexible display module according to an embodiment of this application.

FIG. 9 is a schematic diagram of a cross-sectional structure of a flexible display module according to an embodiment of this application. In an optional embodiment, the rigid backplane body 231 may be a rigid light-transmitting backplane body 231. In other words, the rigid backplane body 231 and the rigid light-transmitting component 232 are of an integral structure. Therefore, the flexible display module 200 includes only one rigid backplane, and the rigid backplane is a rigid light-transmitting backplane. In this solution, the rigid backplane does not need to be provided with the through hole 2311, and a complete support structure may be directly provided for the flexible display panel 220, to resolve a problem that the flexible display panel 220 or the optical device 240 is easily damaged due to a structure of the through hole 2311 in the conventional technology. In addition, the flexible display module 200 in this solution is of a simple structure, it is convenient to manufacture and install the flexible display module 200, and it is convenient to implement thinning processing of the flexible display module 200.

In a specific embodiment, a material of the rigid light-transmitting component 232 is not limited. For example, the rigid light-transmitting component 232 may be a glass rigid light-transmitting component 232, or may be a resin rigid light-transmitting component 232. A proper material may be selected based on a requirement to manufacture the rigid light-transmitting component 232, and the rigid light-transmitting component 232 only needs to be rigid and have a light transmission feature. The rigid light-transmitting component 232 in this application may be a transparent device, in other words, has a high light transmission feature, to help implement a function of the optical device 240, and improve an operating effect of the optical device 240.

In an optional solution, the rigid light-transmitting device 232 may further have specific optical performance based on a requirement of the optical device 240, for example, light enhancement performance, wave filtering performance, or light gathering performance. All the optical performance may be designed based on a requirement, to improve an operating effect of the optical device 240.

Figure 10:
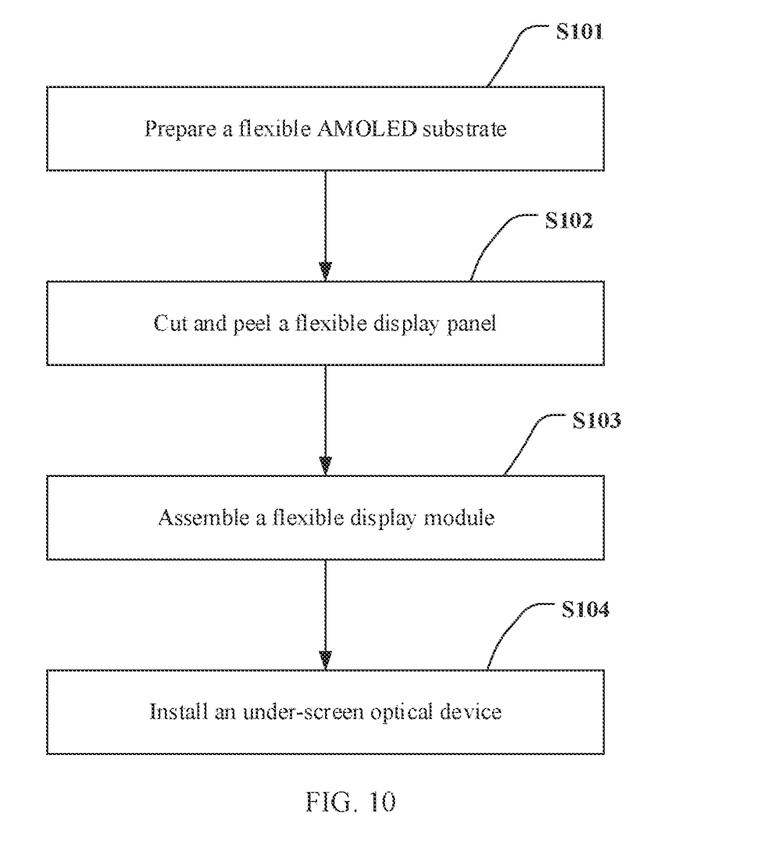
FIG. 10 is a flowchart of a manufacturing process of a flexible display module according to an embodiment of this application.

In a specific embodiment, a flexible display module may be an AMOLED display module. Specifically, a flexible display module may be prepared in the following process steps. FIG. 10 is a flowchart of a manufacturing process of a flexible display module according to an embodiment of this application.

Step S101: Prepare a flexible AMOLED substrate.

First, a liquid polyimide material is coated on a glass substrate and cured at a high temperature to form a flexible substrate, and a flexible AMOLED array substrate is prepared by using a yellow light process. Then, a pixel cell and an electrode are defined by using a fine masking process. Finally, an organic/inorganic composite film layer is deposited on the AMOLED array substrate, and the AMOLED array substrate is encapsulated, to complete preparation of the AMOLED substrate.

Step S102: Cut and peel a flexible display panel.

The substrate prepared in step S101 is cut by using a tool such as a laser or a knife wheel, and the laser is used to heat a thermal release adhesive on the glass substrate, to separate the substrate from the glass substrate, so as to obtain the flexible display panel.

Step S103: Assemble the flexible display module.

A film layer such as a polarizer or a touchscreen is laminated on the top of the flexible display panel, pins of a chip and a flexible circuit board are bonded to a terminal of a substrate in a pin-to-pin manner through an outer lead bonding process, and then a reinforced backplane and a surface cover are assembled. A pre-opening design is provided for the polarizer and the backplane at a corresponding location at which an under-screen optical device needs to be installed, and a rigid light-transmitting component is disposed between the optical device and the flexible display panel.

Step S104: Install the under-screen optical device.

An optical device such as an under-screen fingerprint recognition device, an under-screen camera, and an under-screen ambient light sensor is fastened to an opening location by using an optical adhesive, to complete an under-screen component module process.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A flexible display module, comprising:
a flexible display panel;
an optical device; and
a rigid backplane component located between the flexible display panel and the optical device and comprising:
a side that is away from the flexible display panel, wherein the optical device is disposed on the side;
a rigid backplane body; and
a rigid light-transmitting component,
wherein the rigid backplane body and the rigid light-transmitting component are of an integral structure,
wherein the rigid backplane body comprises a through hole in a one-to-one correspondence with the optical device,
wherein the rigid light-transmitting component is located in the through hole, and
wherein the rigid light-transmitting component comprises a curable adhesive.

2. The flexible display module of claim 1, wherein the rigid light-transmitting component comprises a rigid light-transmitting block, and wherein the rigid light-transmitting block is fixedly installed in the through hole.

3. The flexible display module of claim 2, wherein the through hole comprises a first through hole and a second through hole that are sequentially disposed in a direction away from the flexible display panel, wherein the first through hole comprises a first aperture, wherein the second through hole comprises a second aperture, wherein a first size of the first aperture is greater than a second size of the second aperture, and wherein the rigid light-transmitting block fits into the through hole.

4. The flexible display module of claim 1, wherein the rigid light-transmitting component comprises a first surface, wherein the rigid backplane body comprises a second surface, and wherein the first surface and the second surface are flush.

5. The flexible display module of claim 1, wherein the rigid light-transmitting component is a glass rigid light-transmitting component, a plastic rigid light-transmitting component, or a resin rigid light-transmitting component.

6. The flexible display module of claim 1, wherein the rigid light-transmitting component is a glass rigid light-transmitting component.

7. The flexible display module of claim 1, wherein the rigid light-transmitting component is a plastic rigid light-transmitting component.

8. The flexible display module of claim 1, wherein the rigid light-transmitting component is a resin rigid light-transmitting component.

9. A flexible display apparatus, comprising:
a flexible display module comprising:
a flexible display panel;
an optical device; and
a rigid backplane component located between the flexible display panel and the optical device and comprising:
a side that is away from the flexible display panel, wherein the optical device is disposed on the side;
a rigid backplane body; and
a rigid light-transmitting component,
wherein the rigid backplane body and the rigid light-transmitting component are of an integral structure,
wherein the rigid backplane body comprises a through hole in a one-to-one correspondence with the optical device,
wherein the rigid light-transmitting component is located in the through hole, and
wherein the rigid light-transmitting component comprises a curable adhesive.

10. The flexible display apparatus of claim 9, wherein the rigid light-transmitting component is a glass rigid light-transmitting component, a plastic rigid light-transmitting component, or a resin rigid light-transmitting component.

11. The flexible display apparatus of claim 9, wherein the rigid light-transmitting component is a glass rigid light-transmitting component.

12. The flexible display apparatus of claim 9, wherein the rigid light-transmitting component is a plastic rigid light-transmitting component.

13. The flexible display apparatus of claim 9, wherein the rigid light-transmitting component is a resin rigid light-transmitting component.

14. The flexible display apparatus of claim 9, wherein the rigid light-transmitting component comprises a rigid light-transmitting block, and wherein the rigid light-transmitting block is fixedly installed in the through hole.

15. A flexible display apparatus, comprising:
a flexible display module comprising:
a flexible display panel;
an optical device; and
a rigid backplane component located between the flexible display panel and the optical device and comprising:
a side that is away from the flexible display panel, wherein the optical device is disposed on the side;
a rigid backplane body; and
a rigid light-transmitting component,
wherein the rigid backplane body and the rigid light-transmitting component are of an integral structure, and
wherein the rigid light-transmitting component is a glass rigid light-transmitting component.

16. The flexible display apparatus of claim 15, wherein the rigid backplane body comprises a through hole in a one-to-one correspondence with the optical device, and wherein the rigid light-transmitting component is located in the through hole.

17. The flexible display apparatus of claim 16, wherein the rigid light-transmitting component comprises a curable adhesive.

18. The flexible display apparatus of claim 16, wherein the rigid light-transmitting component comprises a rigid light-transmitting block, and wherein the rigid light-transmitting block is fixedly installed in the through hole.

19. The flexible display apparatus of claim 18, wherein the through hole comprises a first through hole and a second through hole that are sequentially disposed in a direction away from the flexible display panel, wherein the first through hole comprises a first aperture, wherein the second through hole comprises a second aperture, wherein a first size of the first aperture is greater than a second size of the second aperture, and wherein the rigid light-transmitting block fits into the through hole.

20. The flexible display apparatus of claim 16, wherein the rigid light-transmitting component comprises a first surface, wherein the rigid backplane body comprises a second surface, and wherein the first surface and the second surface are flush.

21. The flexible display apparatus of claim 15, wherein the rigid backplane body comprises a through hole in a one-to-one correspondence with the optical device, wherein the rigid light-transmitting component is a rigid light-transmitting plate stacked on the rigid backplane body, and wherein the rigid light-transmitting plate is located between the rigid backplane body and the flexible display panel.

* * * * *

UNITED STATES PATENT AND TRADEMARK OFFICE
CERTIFICATE OF CORRECTION

| | |
|---|---|
| PATENT NO. | : 12,111,696 B2 |
| APPLICATION NO. | : 17/769123 |
| DATED | : October 8, 2024 |
| INVENTOR(S) | : Liangyu Pan et al. |

It is certified that error appears in the above-identified patent and that said Letters Patent is hereby corrected as shown below:

On the Title Page

Page 2, (56) References cited, Foreign Patent Documents: "IN 210956676 U 7/2020" should read "CN 210956676 U 7/2020"

Signed and Sealed this
Twenty-sixth Day of November, 2024

Katherine Kelly Vidal
*Director of the United States Patent and Trademark Office*